United States Patent
Shiu et al.

(10) Patent No.: US 11,549,990 B2
(45) Date of Patent: Jan. 10, 2023

(54) CAPACITY JUDGMENT MODULE AND CAPACITY CALIBRATION METHOD THEREOF

(71) Applicant: Gunitech Corp., Hsinchu County (TW)

(72) Inventors: Huan-Ruei Shiu, Qionlin Township (TW); Chung-Liang Hsu, Qionlin Township (TW); Ming-Yi Wang, Qionlin Township (TW); Hsin-Yi Kao, Qionlin Township (TW)

(73) Assignee: Gunitech Corp., Qionlin Township (TW)

(*) Notice: Subject to any disclaimer, the term of this patent is extended or adjusted under 35 U.S.C. 154(b) by 106 days.

(21) Appl. No.: 17/100,026

(22) Filed: Nov. 20, 2020

(65) Prior Publication Data
US 2021/0382117 A1 Dec. 9, 2021

(30) Foreign Application Priority Data
Jun. 9, 2020 (TW) .................................. 109119345

(51) Int. Cl.
*G01R 31/371* (2019.01)
*G01R 31/3835* (2019.01)

(52) U.S. Cl.
CPC ....... *G01R 31/371* (2019.01); *G01R 31/3835* (2019.01)

(58) Field of Classification Search
None
See application file for complete search history.

(56) References Cited

U.S. PATENT DOCUMENTS

| | | | |
|---|---|---|---|
| 5,633,592 A * | 5/1997 | Lang ................. | G01R 19/16542 324/426 |
| 2002/0093312 A1* | 7/2002 | Choo .................... | H02J 7/0047 320/149 |
| 2008/0174264 A1* | 7/2008 | Nomoto ................ | H04M 1/724 320/106 |
| 2015/0212163 A1* | 7/2015 | Nomura ............. | G01R 31/3648 702/63 |
| 2016/0061908 A1* | 3/2016 | Torai .................... | G01R 31/389 702/63 |

* cited by examiner

*Primary Examiner* — Jas A Sanghera
(74) *Attorney, Agent, or Firm* — Alan D. Kamrath; Karin L. Williams; Mayer & Williams PC

(57) ABSTRACT

A capacity judgment module and a capacity calibration method thereof are disclosed. The capacity judgment module is used to judge a capacity of a battery installed in an electronic device. The capacity judgment module includes a database, a voltage detection module and a processing module. The database is used to store the voltage-capacity comparison curve. The voltage detection module is used to obtain a voltage value interval between a maximum use voltage value and a minimum use voltage value of the electronic device so as to divide the voltage value interval into a plurality of levels. The processing module is used to query the voltage-capacity comparison curve to actually modify the plurality of levels of the voltage value interval of the electronic device and the battery capacity ratio according to the voltage-capacity comparison curve, thereby creating a new voltage-capacity comparison table,

15 Claims, 2 Drawing Sheets

CAPACITY JUDGMENT MODULE AND CAPACITY CALIBRATION METHOD THEREOF

BACKGROUND OF THE INVENTION

1. Field of the Invention

The present invention relates to a capacity judgment module and a capacity calibration method thereof; more particularly, the present invention relates to a capacity judgment module and a capacity calibration method thereof capable of making adjustments according to an actual voltage value interval of an electronic device.

2. Description of the Related Art

In known prior arts, if there is a need for judging a capacity of a battery of an electronic device, normally a voltage-capacity comparison table is queried by means of utilizing a voltage value to find out a capacity ratio. However, such a voltage-capacity comparison table is usually provided by a battery manufacturer upon shipment of the battery without being adjusted in accordance with different electronic devices. Because the relationship between the voltage and the capacity is not a straightforward proportional relationship, there might be errors when it comes to data conversion. Especially when the electronic device is at low capacity, if the capacity is incorrectly displayed while the actual capacity of the battery is low, the user will be mislead to presume that the electronic device still has power, which will therefore result in an unexpected shutdown if the user keeps using the electronic device.

Therefore, there is a need to provide a capacity judgment module and a capacity calibration method thereof to mitigate and/or obviate the aforementioned problems.

SUMMARY OF THE INVENTION

It is an object of the present invention to provide a capacity judgment module capable of making adjustments according to an actual voltage value interval of an electronic device.

It is another object of the present invention to provide a capacity calibration method used in the abovementioned capacity judgment module.

To achieve the abovementioned objects, the capacity judgment module of the present invention is used for judging a capacity of a battery is installed in an electronic device. The capacity judgment module comprises a database, a voltage detection module and a processing module. The database is used for storing a voltage-capacity comparison curve, wherein the voltage-capacity comparison curve indicates a voltage-capacity relationship from a maximum supply voltage to a minimum supply voltage of the battery, The voltage detection module is used for detecting a real-time voltage value of the electronic device and for obtaining a voltage value interval between a maximum use voltage value and a minimum use voltage value of the electronic device so as to divide the voltage value interval into a plurality of levels, The processing module is electrically connected to the database and the voltage detection module and is used for querying the voltage-capacity comparison curve so as to actually modify the plurality of levels of the voltage value interval of the electronic device and a battery capacity ratio according to the voltage-capacity comparison curve, thereby creating a new voltage-capacity comparison table for being stored in the database.

The capacity calibration method of the present invention comprises the following steps: detecting a voltage value interval between a maximum use voltage value and a minimum use voltage value of the electronic device; dividing the voltage value interval into a plurality of levels; querying a voltage-capacity comparison curve, wherein the voltage-capacity comparison curve indicates a voltage-capacity relationship from a maximum supply voltage to a minimum supply voltage of the battery; actually modifying the plurality of levels of the voltage value interval of the electronic device and a battery capacity ratio according to the voltage-capacity comparison curve; and creating a new voltage-capacity comparison table.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
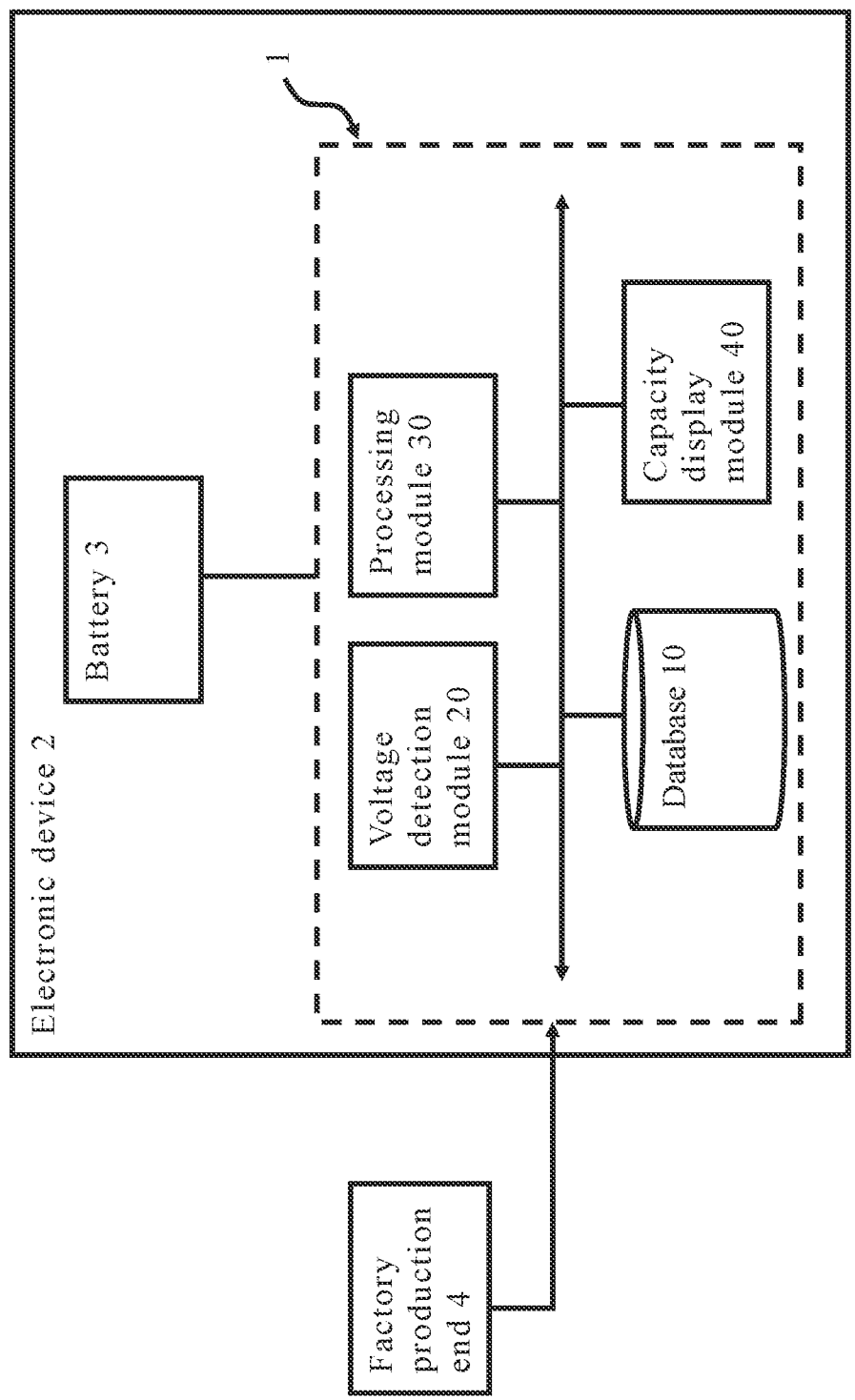
FIG. 1 illustrates a structural drawing of a capacity judgment module according to the present invention.

Please refer to FIG. 1, which illustrates a structural drawing of a capacity judgment module according to the present invention, The capacity judgment module 1 of the present invention is used for judging a capacity of a battery 3 installed in an electronic device 2, and thereby for calibrating the display of the capacity of the battery 3. Without limiting the scope of the present invention, the electronic device 2 can be a smart phone, a table computer or a laptop computer, and the battery 3 can be a nickel-metal hydride battery or a lithium-ion battery. The capacity judgment module 1 can be installed inside the electronic device 2 or installed in an external storage device which connects to the electronic device 2 such that a factory production end 4 may directly activate the capacity judgment module 1 via OTA/FTP/WEB/TFTP to calibrate the capacity of the battery 3 of the electronic device 2. However, please note that the scope of the present invention is not limited to the above activation mechanism.

The capacity judgment module 1 comprises a database 10, a voltage detection module 20, a processing module 30 and a capacity display module 40. The database 10 is used for storing a voltage-capacity comparison curve. The voltage-capacity comparison curve is provided by the manufacturer of the battery 3 for indicating a voltage-capacity loss relationship from a maximum supply voltage to a minimum supply voltage of the battery 3. The voltage detection module 20 is used for detecting a real-tinge voltage of the electronic device 2 and for obtaining a voltage value interval. The voltage value intervals an interval between a maximum use voltage value and a minimum use voltage value of the electronic device 2. For example, the maximum use voltage value of the electronic device 2 is 240V and the minimum use voltage value thereof is 110V As a result, the voltage value is interval is between 110V, and 240V. Meanwhile, the voltage value interval can be divided into a plurality of levels, such as being divided evenly into 10 levels including 100%, 90%, 80%, and so on.

The processing module 30 is electrically connected to the database 10 and the voltage detection module 20 and is used for querying the voltage-capacity comparison curve so as to actually modify the plurality of levels of the voltage value interval of the electronic device 2 and a capacity ratio of the battery 3 according to the voltage-capacity comparison curve. The processing module 30 replaces the voltage-capacity comparison curve by means of creating a new voltage-capacity comparison table for being stored in the database 10. That is, the processing module 30 utilizes a voltage value of 100% of the maximum use voltage value to query the voltage-capacity comparison curve so as to obtain the capacity of the battery 3 at that maximum use voltage value. Similarly, the processing module 30 utilizes a voltage value of 90% of the maximum use voltage value to query the voltage-capacity comparison curve so as to obtain the capacity of the battery 3. Then the processing module 30 repeats the above steps until the capacity at the minimum use voltage value has been obtained. After the capacities of the battery 3 corresponding to all levels (in this embodiment there are 10 levels) within the voltage value interval of the electronic device 2 are all obtained, the processing module 30 can create the new voltage-capacity comparison table accordingly. As a result, the loss relationship between the actual use voltage and the capacity of the electronic device 2 can be established instead of the loss relationship between the supply voltage and the capacity of the battery 3.

However, in order to solve the problem of differences among different types of electronic devices 2, the capacity judgment module 1 can further perform actual comparison table queries according to the maximum use voltage values and the minimum use voltage values of different electronic devices 2; therefore, each electronic device 2 will create its own "new voltage-capacity comparison table". Furthermore, even for the same type of electronic device 2, the maximum use voltage value and the minimum use voltage value of each electronic device 2 might still be different from their respective default values. For example, if the default value of the maximum use voltage value is 3V it is possible that the actually measured maximum use voltage value is 2.9V In this regard, synchronous deviation might occur if the new voltage-capacity comparison table is directly applied. Therefore, the capacity judgment module 1 can also further utilize the voltage detection module 20 to measure the electronic device 2 so as to obtain the actual maximum use voltage value and the minimum use voltage value and then correct the deviation difference value accordingly. Thereby, the problem of individual differences among electronic devices 2 can be solved. Please note that in the process of creating the above new voltage-capacity comparison table, in order to prevent misjudgment, the processing module 30 needs to prevent the electronic device 2 from executing behaviors which might generate a sudden high voltage, such as a sudden high loss of power caused by activating an infrared PIR sensor or by continuously pressing keys.

Finally, the capacity display module 40 can be an application software (app) installed in the electronic device 2. By means of querying the new voltage-capacity comparison table stored in the database 10 obtained from the voltage detection module 20, the capacity display module 40 can more precisely display the capacity of the battery 3 to the user. On the other hand, the voltage detection module 20 can constantly read the voltage value. For example, the voltage detection module 20 can utilize real-time voltage values of every 10 measurements as a cycle, utilize the first-time real-time voltage value as a reference value for comparing the rest 9 real-time voltage values with the first-time real-time voltage value, and then divide the sum of the difference values by the number of levels so as to obtain a difference value to be used as a first-time voltage difference adjustment value. Please note that there are a variety of methods of obtaining measurement values for performing difference adjustment; the present invention may adopt any of the applicable methods to find the difference adjustment value without limiting the scope of the present invention. As a result, the capacity display module 40 can more precisely display the capacity of the battery 3.

On the other hand, after accurately obtaining the capacity of the battery 3, the processing module 30 can further set up a first low capacity threshold and a second low capacity threshold for the battery 3 as warnings of low capacity. When the processing module 30 detects that the capacity of the battery 3 reaches the first low capacity threshold, the processing module 30 can control an LED light of the electronic device 2 to flash and a speaker thereof to make sound. When the capacity of the battery 3 reaches the second low capacity threshold, the processing module 30 can control only a low-power LED light to flash. The above two-phase reminder can remind the user to prevent the battery 3 from over-exhaustion.

Please note that each of the modules included in the capacity judgment module 1 can be a hardware device, a software program in combination with a hardware device, a firmware in combination with a hardware device, or a combination thereof Further, the abovementioned embodiments only describe preferred embodiments of the present invention. To avoid redundant description, not all possible variations and combinations are described in detail in this specification. However, those skilled in the art will understand the above modules or components are not all necessary parts. In addition, in order to implement the present invention, other more detailed known modules or components might also be included, It is possible that each module or component can be omitted or modified depending on different requirements, and it is also possible that other modules or components might be disposed between any two modules.

Figure 2:
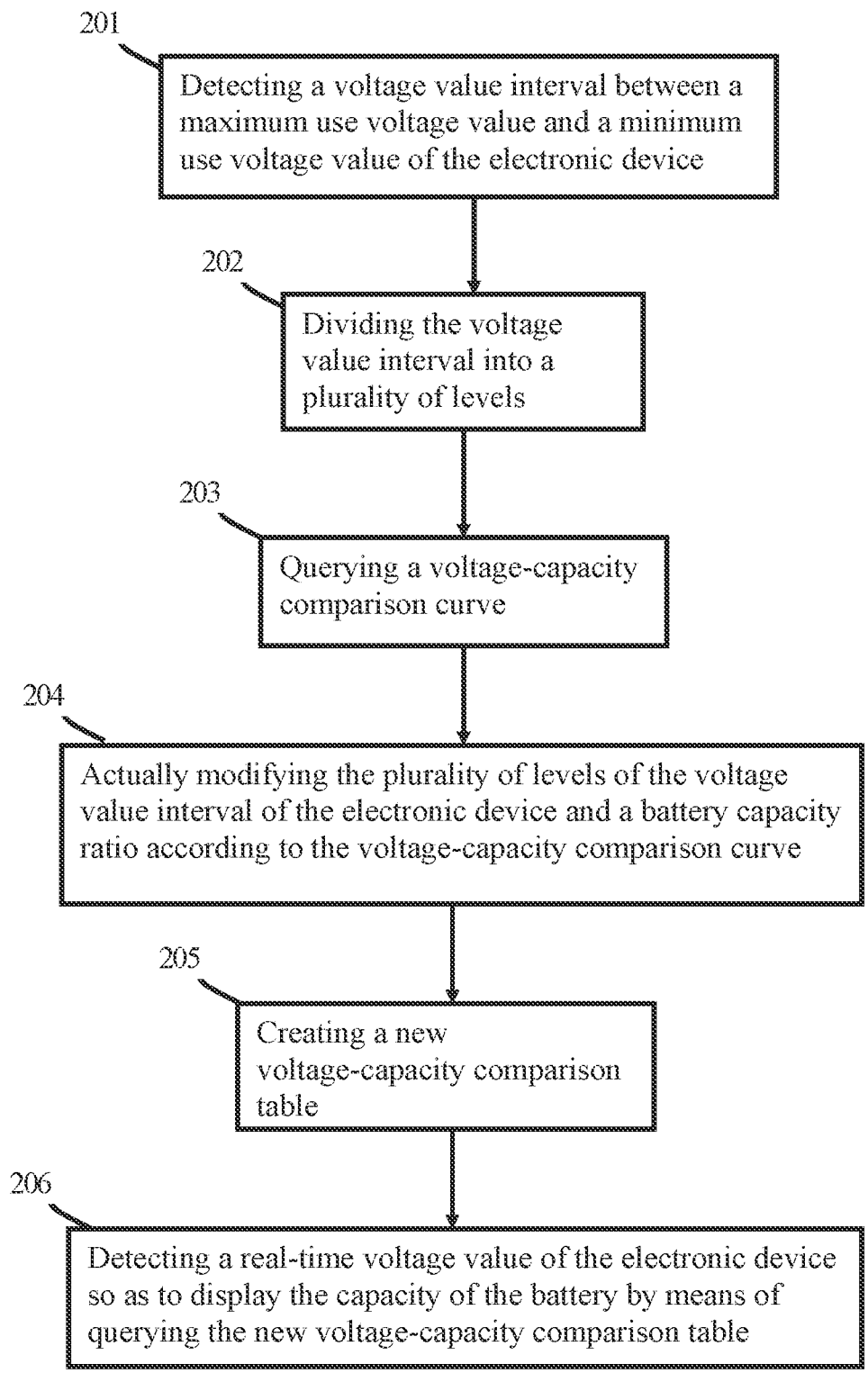
FIG. 2 illustrates a flowchart of a capacity calibration method according to the present invention.

Next, please refer to FIG. 2, which illustrates a flowchart of a capacity calibration method according to the present invention. Please note that the above capacity judgment module 1 is used only as a example for explaining the method of the capacity calibration method without limiting the scope of the present invention. The capacity calibration method of the present invention may be implemented in other equivalent structures.

The capacity calibration method of the present invention first performs step 201: detecting a voltage value interval between a maximum use voltage value and a minimum use voltage value of the electronic device.

First, the capacity detection module 20 detects an interval between a maximum use voltage value and a minimum use voltage value to set as a voltage value interval.

Then the present invention performs step 202: dividing the voltage value interval into a plurality of levels.

The method of the present invention then divides the voltage value interval into a plurality of levels, such as 10 levels in this embodiment; however, the number of levels into which the voltage value interval is to be divided is not limited to this embodiment.

Next, the present invention performs step 203: querying a voltage-capacity comparison curve.

In this step, the processing module 30 queries the voltage-capacity comparison curve stored in the database 10.

The present invention further performs step 204: actually modifying the plurality of levels of the voltage value interval of the electronic device and a battery capacity ratio according to the voltage-capacity comparison curve, The processing module 30 actually modifies the plurality of levels of the voltage value interval of the electronic device 2 and the capacity ratio of the battery 3. That is, the processing module 30 queries the capacities of the battery 3 corresponding to each level (i.e. 100%, 90%, 80% . . . till 0%) between the maximum use voltage value and the minimum use voltage value.

As a result, the present invention can then perform step 205: creating a new voltage-capacity comparison table.

The processing module 30 then creates a new voltage-capacity comparison table from the maximum use voltage value to the minimum use voltage value.

Finally, the present invention performs step 206: detecting a real-time voltage value of the electronic device so as to display the capacity of the battery by means of querying the new voltage-capacity comparison table.

Finally, the capacity display module 40 utilizes the real-time voltage value obtained from the voltage detection module 20 to query the new voltage-capacity comparison table stored in the database 10 so as to more precisely display the capacity of the battery 3 to the user.

The processing module 30 will create new voltage-capacity comparison tables respectively corresponding to different types of electronic devices 2, adjust possible differences between the default value and the maximum use voltage value or the minimum use voltage value of each electronic device 2, and at the same time prevent the electronic device 2 from executing a procedure which would result in a sudden high voltage upon calibration of the present invention so as to obtain an accurate new voltage-capacity comparison table. Please note that the capacity calibration method of the present invention is not limited to being executed according to the above order of steps and that the order of steps may be altered as long as the object of the present invention can be achieved.

According to the capacity calibration method and the capacity judgment module 1 of the present invention, the capacity of the battery 3 can be accurately obtained, thereby protecting the electronic device 2 from damage.

Please note that the abovementioned embodiments only describe preferred embodiments of the present invention. To avoid redundant description, not all possible variations and combinations are described in detail in this specification. However, those skilled in the art will understand that the above modules or components are not all necessary parts. In addition, in order to implement the present invention, other more detailed known modules or components might also be included. It is possible that each module or component can be omitted or modified depending on different requirements, and it is also possible that other modules or components might be disposed between any two modules.

Although the present invention has been explained in relation to its preferred embodiments, it is to be understood that many other possible modifications and variations can be made without departing from the spirit and scope of the invention as hereinafter claimed.

What is claimed is:

1. A capacity judgment module, used for judging a capacity of a battery installed in an electronic device, the capacity judgment module comprising:
   a database, used for storing a voltage-capacity comparison curve, wherein the voltage-capacity comparison curve indicates a voltage-capacity relationship from a maximum supply voltage to a minimum supply voltage of the battery;
   a voltage detection module, used for detecting a real-time voltage value of the electronic device and for obtaining a voltage value interval between a maximum use voltage value and a minimum use voltage value of the electronic device so as to divide the voltage value interval into a plurality of levels; and
   a processing module, electrically connected to the database and the voltage detection module, used for querying the voltage-capacity comparison curve to actually modify the plurality of levels of the voltage value interval of the electronic device and a battery capacity ratio according to the voltage-capacity comparison curve, thereby creating a new voltage-capacity comparison table for being stored in the database.

2. The capacity judgment module as claimed in claim 1, further comprising a capacity display module, used for displaying the capacity of the battery so as to query the new voltage-capacity comparison table according to the real-time voltage value.

3. The capacity judgment module as claimed in claim 2, wherein the voltage detection module further constantly reads the voltage value in order to perform difference adjustments in response to real-time voltage values.

4. The capacity judgment module as claimed in claim 1, wherein the voltage detection module further constantly reads the voltage value in order to perform difference adjustments in response to real-time voltage values.

5. The capacity judgment module as claimed in claim 1, wherein the voltage detection module divides the voltage value interval from the maximum use voltage value to the minimum use voltage value evenly into 10 levels.

6. The capacity judgment module as claimed in claim 1, wherein the processing module further prevents the electronic device from executing an error-prone procedure in the process of creating the new voltage-capacity comparison table.

7. The capacity judgment module as claimed in claim 1, wherein the processing module further performs difference calculations of the maximum use voltage value and the minimum use voltage value according to different electronic devices.

8. The capacity judgment module as claimed in claim 1, wherein the processing module further sets up a first low capacity threshold and a second low capacity threshold.

9. A capacity calibration method, used for calibrating the display of a capacity of a battery installed in an electronic device, the method comprising the following steps:
   detecting a voltage value interval between a maximum use voltage value and a minimum use voltage value of the electronic device;
   dividing the voltage value interval into a plurality of levels;
   querying a voltage-capacity comparison curve, wherein the voltage-capacity comparison curve indicates a voltage-capacity relationship from a maximum supply voltage to a minimum supply voltage of the battery;

actually modifying the plurality of levels of the voltage value interval of the electronic device and a battery capacity ratio according to the voltage-capacity comparison curve; and creating a new voltage-capacity comparison table.

10. The capacity calibration method as claimed in claim 9, further comprising the following step:

detecting a real-time voltage value of the electronic device so as to query the new voltage-capacity comparison table to display the capacity of the battery.

11. The capacity calibration method as claimed in claim 10, further comprising the following step:

constantly reading the voltage value in order to perform difference adjustments in response to real-time voltage values.

12. The capacity calibration method as claimed in claim 9, further comprising the following step:

constantly reading the voltage value in order to perform difference adjustments in response to real-time voltage values.

13. The capacity calibration method as claimed in claim 9, wherein the step of dividing the voltage value interval into a plurality of levels further comprises dividing the voltage value interval from the maximum use voltage value to the minimum use voltage value evenly into 10 levels.

14. The capacity calibration method as claimed in claim 9, further comprising the following step:

preventing the electronic device from executing an error-prone procedure.

15. The capacity calibration method as claimed in claim 9, further comprising the following step:

performing difference calculations on the maximum use voltage value and the minimum use voltage value according to different electronic devices.

* * * * *